(12) United States Patent
Baker et al.

(10) Patent No.: US 7,667,980 B2
(45) Date of Patent: Feb. 23, 2010

(54) PRINTED CIRCUIT BOARDS FOR COUNTERING SIGNAL DISTORTION

(75) Inventors: Brian A. Baker, Raleigh, NC (US);
James E. Hughes, Apex, NC (US);
Thomas D. Pahel, Jr., Raleigh, NC (US); Pravin Patel, Cary, NC (US);
Challis L. Purrington, Raleigh, NC (US); Christopher C. West, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 11/539,990

(22) Filed: Oct. 10, 2006

(65) Prior Publication Data
US 2008/0084679 A1 Apr. 10, 2008

(51) Int. Cl.
*H05K 7/00* (2006.01)
(52) U.S. Cl. ...................... 361/782; 174/262
(58) Field of Classification Search ........... 361/782, 361/794, 795; 174/255, 262–265; 29/825, 29/829, 836
See application file for complete search history.

(56) References Cited

U.S. PATENT DOCUMENTS

| | | | |
|---|---|---|---|
| 5,912,809 A * | 6/1999 | Steigerwald et al. ........ 361/780 |
| 6,314,142 B1 | 11/2001 | Perthold et al. | |
| 6,407,609 B1 | 6/2002 | Aggarwal et al. | |
| 6,521,843 B1 * | 2/2003 | Kohya ................ 174/255 |
| 6,566,891 B1 | 5/2003 | Aggarwal et al. | |
| 6,665,351 B2 | 12/2003 | Hedberg | |
| 6,690,744 B2 | 2/2004 | Hedberg | |
| 6,781,454 B1 | 8/2004 | Kirkman | |
| 6,788,139 B2 | 9/2004 | Villemazet et al. | |
| 7,013,452 B2 * | 3/2006 | Baras et al. .............. 716/15 |
| 2003/0141942 A1 | 7/2003 | McMorrow et al. | |
| 2004/0071219 A1 | 4/2004 | Vorenkamp et al. | |
| 2005/0161255 A1 * | 7/2005 | Takada ................. 174/262 |

FOREIGN PATENT DOCUMENTS

JP 2004289164 A 9/2004
WO WO2004034078 A2 4/2004

* cited by examiner

*Primary Examiner*—Dean A. Reichard
*Assistant Examiner*—Yuriy Semenenko
(74) *Attorney, Agent, or Firm*—John Biggers; Cynthia G. Seal; Biggers & OHanian LLP.

(57) ABSTRACT

Printed circuit boards for countering signal distortion are disclosed that include: a conductive pathway on a printed circuit board between a transmitter and a receiver, the conductive pathway comprised of traces and vias connected together for conductive transfer of a signal from the transmitter to the receiver; a parasitic element on the printed circuit board, the parasitic element having a parasitic effect that distorts the signal; and one or more passive elements mounted adjacent to the conductive pathway without connecting to the conductive pathway, the passive elements having a corrective effect to reduce the distortion from the parasitic effect on the signal.

20 Claims, 6 Drawing Sheets

PRINTED CIRCUIT BOARDS FOR COUNTERING SIGNAL DISTORTION

BACKGROUND OF THE INVENTION

1. Field of the Invention

The field of the invention is printed circuit boards for countering signal distortion and methods of countering signal distortion on a printed circuit board.

2. Description of Related Art

In modern electronic systems, electronic components are typically connected together for communication using printed circuit boards ('PCB'). A printed circuit board is flat panel that interconnects electronic components using a pattern of flat conductors, often referred to as 'traces,' laminated onto a non-conductive substrate. A printed circuit board may contain trace patterns on the top and bottom surfaces of the printed circuit board or in layers through the middle of the printed circuit board. Traces on different layers of a printed circuit board interconnect through 'vias.' Vias are conductors that plate the walls of holes extending through the layers of the printed circuit board.

For further explanation, FIG. 1A sets forth a cross-sectional front plan view of an exemplary printed circuit board (100) in the current art that includes a transmission pathway (106) between a transmitter (102) and a receiver (104). FIG. 1B sets forth a top plan view of the exemplary printed circuit board (100) illustrated in FIG. 1A. The transmitter (102) and the receiver (104) of FIGS. 1A and 1B mount to the surface of a printed circuit board and connect at designated portions of the trace pattern called 'pads,' or synonymously referred to as 'lands.' The transmitter (102) and the receiver (104) may be connected to the printed circuit board using, for example, surface mounting technology, through-hole mounting technology, or any other technology as will occur to those of skill in the art. Surface mount technology connects electronic components to a printed circuit board by soldering electronic component leads or terminals to the top surface of the printed circuit board. Through-hole mount technology connects electronic components to a printed circuit board by inserting component leads through holes in the printed circuit board and then soldering the leads in place on the opposite side of the printed circuit board.

A single printed circuit board typically includes one or more conductive pathways. A conductive pathway is the combination of traces and vias connected together that allow electronic components to propagate signals to one another using electric conduction. The exemplary printed circuit board (100) of FIGS. 1A and 1B includes a transmission pathway (106). The transmission pathway (106) includes trace (110), via (120), trace (112), via (122), and trace (114). The transmission pathway (106) provides a path that allows the transmitter (102) to propagate a signal to the receiver (104) by electrical conduction.

When the signal includes frequency components with corresponding wavelengths comparable to the length of the transmission pathway (106), parasitic elements of the printed circuit board often produce parasitic effects that distort the signal. A parasitic effect is the signal interference that results when the high frequency components of the signal interact with the physical topology of the printed circuit board used to interconnect the components. Examples of parasitic effects include parasitic capacitance and parasitic inductance. Parasitic capacitance is the capacitive interference that results from the storage of stray charges in the PCB elements that make up the conductive pathway between electronic components. Parasitic inductance is the inductive interference that results from the storage of a stray magnetic field around the PCB elements that make up the conductive pathway between electronic components.

A parasitic element is an interconnect component of the printed circuit board that distorts a signal propagated from a transmitter to a receiver. An example of a parasitic element may include an unused portion of via that produces parasitic capacitance when the high frequency components of a signal interact with the via and the reference plane. An example of a parasitic element that produces parasitic inductance may include the conductive trace or via used to connect two components together. As the current oscillates its polarity at high frequencies in these conductors, a magnetic field establishes and collapses around the conductors at a corresponding frequency that operates to resist changes in the current. Often parasitic inductance may be minimized by dedicating an entire layer in the PCB for use by a reference plane. Such a reference plane, however, may operate to produce parasitic capacitance as mentioned above with the unused portion of vias or with mounting pads on the surface of the PCB. Although both parasitic capacitance and parasitic inductance occur from the physical topology of most printed circuit boards, typically one of the parasitic effects—either the parasitic capacitance or the parasitic inductance—will dominate in a particular printed circuit board topology to distort the signal propagated between components.

In the exemplary printed circuit board of FIG. 1A, stub (124) is an unused portion of via (120), and stub (126) is an unused portion of via (122). The stubs (124, 126) are parasitic elements producing parasitic capacitance that distort the signal propagated from the transmitter (102) to the receiver (104). In addition, the traces (110, 112, 114) of FIGS. 1A and 1B may operate as parasitic elements producing parasitic inductance that also distort the signal propagated from the transmitter (102) to the receiver (104).

Current solutions to parasitic effects include traditional techniques such as shorter trace length, back filling, buried vias, and blind vias. Using buried or blind vias to reduce the parasitic effects on a signal, however, increases the cost of designing and manufacturing the printed circuit board. Other current solutions such as designing PCBs with shorter trace length are often impossible to implement because of the physical topology of the printed circuit board. For example, the physical properties of a chip, such as its shape, may not permit shorter trace lengths. As such, readers skilled in the art appreciate that room for improvement exists for countering signal distortion on a printed circuit board.

SUMMARY OF THE INVENTION

Printed circuit boards for countering signal distortion are disclosed that include: a conductive pathway on a printed circuit board between a transmitter and a receiver, the conductive pathway comprised of traces and vias connected together for conductive transfer of a signal from the transmitter to the receiver; a parasitic element on the printed circuit board, the parasitic element having a parasitic effect that distorts the signal; and one or more passive elements mounted adjacent to the conductive pathway without connecting to the conductive pathway, the passive elements having a corrective effect to reduce the distortion from the parasitic effect on the signal.

Methods of countering signal distortion on a printed circuit board are disclosed that include: transmitting a signal, by a transmitter to a receiver, along a conductive pathway on a printed circuit board, the conductive pathway comprised of traces and vias connected together for conductive transfer of the signal from the transmitter to the receiver; distorting, by a parasitic element on the printed circuit board, the signal through a parasitic effect; and reducing, by a passive element mounted adjacent to the conductive pathway without connecting to the conductive pathway, the distortion of the signal through a corrective effect.

Methods of countering signal distortion on a printed circuit board are disclosed that include: providing a conductive pathway on a printed circuit board between a transmitter and a receiver, the conductive pathway comprised of traces and vias connected together for conductive transfer of a signal from the transmitter to the receiver; providing a parasitic element on the printed circuit board, the parasitic element having a parasitic effect that distorts the signal; and reducing, by a passive element mounted adjacent to the conductive pathway without connecting to the conductive pathway, the distortion of the signal through a corrective inductance.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1A:
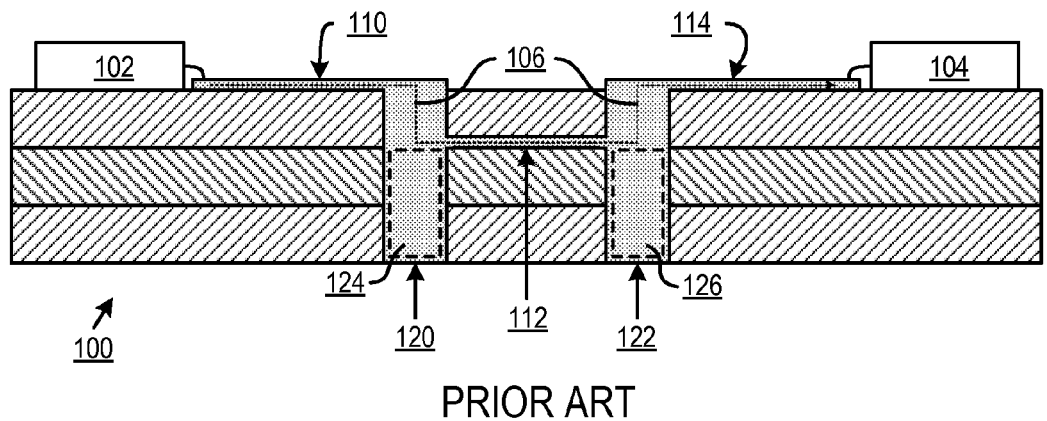
FIG. 1A sets forth a cross-sectional front plan view of an exemplary printed circuit board in the current art.
Figure 1B:
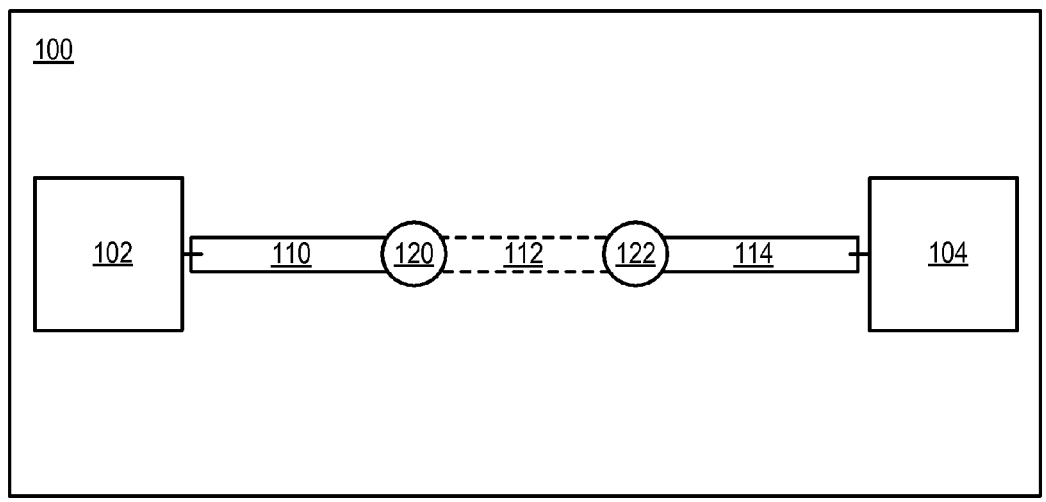
FIG. 1B sets forth a top plan view of the exemplary printed circuit board illustrated in FIG. 1A.
Figure 2A:
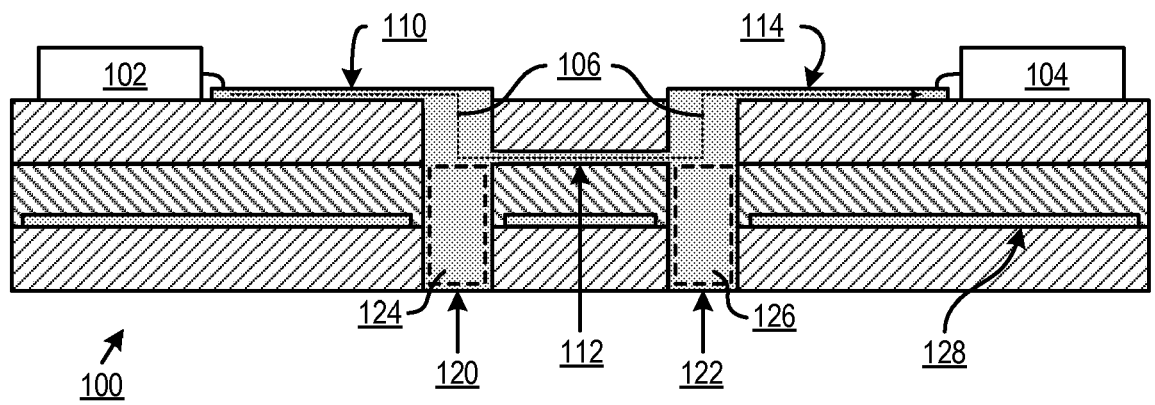
FIG. 2A sets forth a cross-sectional plan view of the exemplary printed circuit board for countering signal distortion according to embodiments of the present invention.
Figure 2B:
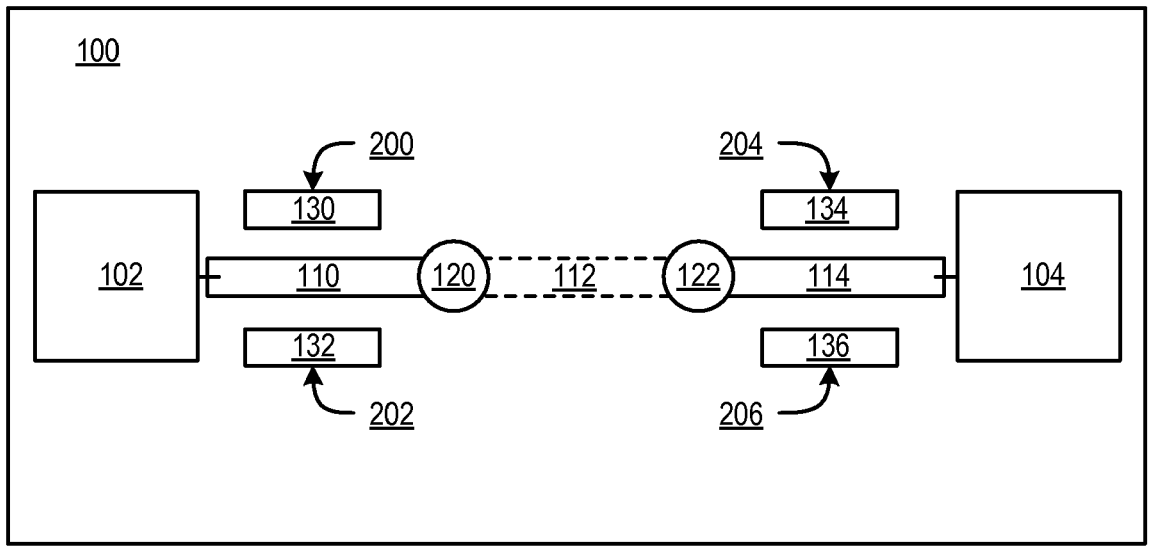
FIG. 2B sets forth a top plan view of the exemplary printed circuit board of FIG. 2A.

Exemplary printed circuit boards for countering signal distortion and exemplary methods of countering signal distortion on a printed circuit board in accordance with the present invention are described with reference to the accompanying drawings, beginning with FIGS. 2A and 2B. FIG. 2A sets forth a cross-sectional plan view of the exemplary printed circuit board (100) for countering signal distortion according to embodiments of the present invention. FIG. 2B sets forth a top plan view of the exemplary printed circuit board (100) of FIG. 2A. The exemplary printed circuit board (100) of FIGS. 2A and 2B includes a conductive pathway (106) on the printed circuit board (100) between a transmitter (102) and a receiver (104). In the example of FIGS. 2A and 2B, the conductive pathway (106) includes traces (110, 112, 114) and vias (120, 122) connected together for conductive transfer of a signal from the transmitter (102) to the receiver (104).

The printed circuit board (100) of FIGS. 2A and 2B also includes a reference plane (128) between the middle and lowest layers of the PCB. A reference plane is a layer of a conductor, such as, for example, copper, that appears to most signals as an infinite ground potential. The reference plane (128) helps reduce noise and ensures that all integrated circuits within a system compare different the voltages of various signals to the same reference potential.

As depicted in FIG. 2A, the exemplary printed circuit board (100) of FIGS. 2A and 2B also includes parasitic elements (124, 126) on the printed circuit board (100). The parasitic elements (124, 126) of FIG. 2A are the stubs formed from the unused portions of the vias (120, 122) respectively. The parasitic elements (124, 126) have a parasitic effect that distorts the signal transmitted from the transmitter (102) to the receiver (104). In the example of FIGS. 2A and 2B, the parasitic elements (124, 126) produce a parasitic effect in the form of parasitic capacitance. Such parasitic capacitance results from the stray electric charges that accumulate in the stubs (124, 126) due to the difference in voltage potential between the vias (120, 122) and the reference plane (128).

To counter to the parasitic capacitance, the exemplary printed circuit board (100) of FIGS. 2A and 2B includes passive elements (200, 202, 204, 206) mounted adjacent to the conductive pathway (106) without connecting to the conductive pathway (106). Each passive element (200, 202, 204, 206) is a passive electrical component providing a corrective effect to reduce the distortion from the parasitic effect on the signal. A corrective effect is counter interference for a signal that substantially reduces or eliminates the parasitic effect that distorts a signal. For example, when the parasitic effect produced by a parasitic element is a parasitic capacitance, the passive element provides a corrective effect that is implemented as corrective inductance to substantially reduce or eliminate the distortion from the parasitic capacitance on the signal. When the parasitic effect produced by a parasitic element is a parasitic inductance, the passive element provides a corrective effect that is implemented as corrective capacitance to substantially reduce or eliminate the distortion from the parasitic inductance on the signal. Substantially reducing or eliminating the distortion caused by a parasitic effect means that the relative strength of the components of a signal transmitted by a transmitter are substantially the same as the relative strength of the components of the signal when received by a receiver. That is, the signal remains intact as it propagates from the transmitter to the receiver although its overall amplitude may be reduced.

As mentioned above, the passive elements (200, 202, 204, 206) are mounted adjacent to the conductive pathway (106) without connecting to the conductive pathway (106). That is, the passive elements are not electrically connected to the conductive pathway using electrical conduction. The non-conductive substrate forming the layers of the printed circuit board (100) acts as an electrical insulator between the passive elements (200, 202, 204, 206) and the conductive pathway (106). The passive elements (200, 202, 204, 206), however, affect the signal propagated along the conductive pathway through the magnetic field coupling that results from the transmission line effects produced as the high frequency components of the signal propagate through the conductive pathway (106). As the signal propagates through the conductive pathway (106), a magnetic field is established around the conductive pathway (106) and induces movement of electric charges along each of the passive elements (200, 202, 204, 206). The movement of the electric charges in the passive elements (200, 202, 204, 206) produces the opposite magnetic field around each passive element (200, 202, 204, 206). The opposite magnetic field of each passive element (200, 202, 204, 206) from the magnetic field of the conductive pathway (106) operates to oppose changes in the current along the conductive pathway (106) used to conduct the signal from the transmitter (102) to the receiver (104). In effect, the passive elements (200, 202, 204, 206) of FIG. 2B provide corrective inductance to reduce the distortion from the parasitic capacitance on the signal.

In the examples of FIGS. 2A and 2B, the passive elements (200, 202, 204, 206) are implemented as traces (130, 132, 134, 136), respectively, on the printed circuit board (100) that extend along the conductive pathway (106). As mentioned above, a trace is a flat conductor laminated onto a non-conductive substrate. The physical characteristics such as, composition, dimensions, and the position of a trace implementing a passive element affect the corrective inductance provided by the trace. The precise physical characteristics for a trace may, therefore, be selected in a manner that optimizes the reduction of the parasitic capacitance that distorts the signal. Readers will note that implementing a passive element as a trace is for explanation and not for limitation. A passive element that provides a corrective effect to reduce signal distortion may also be implemented as a microstrip. Similar to a trace, a microstrip is a thin, flat electrical conductor separated from a reference plane by a layer of insulation or an air gap. A microstrip is used in printed circuit designs where high frequency signals need to be routed from one part of the assembly to another with high efficiency and minimal signal loss due to radiation. In addition, a passive element that provides a corrective effect to reduce signal distortion may also be implemented a trace in series with an inductor, a trace in series with a capacitor, or any passive electric component or combination of passive electric components as will occur to those of skill in the art that operate to provide a corrective effect that reduces the distortion from the parasitic effect on the signal.

The type of passive electric components used to implement the passive element useful in printed circuit boards for countering signal distortion according to embodiments of the present invention will depend on the type of correct effect needed to reduce the distortion. For example, when the parasitic effect is parasitic capacitance, the passive element may be implemented as a trace or a trace in series with an inductor to provide corrective inductance as discussed above and with reference to FIGS. 3A and 3B. When the parasitic effect is parasitic inductance, the passive element may be implemented as a trace in series with a capacitor to provide corrective capacitance as discussed above with reference to FIGS. 4A and 4B.

Readers will note that more than one passive element (200, 202, 204, 206) is mounted along the conductive pathways (106) in the example of FIGS. 2A and 2B. More than one passive element is used in the examples of FIGS. 2A and 2B because each passive element (200, 202, 204, 206) provides a portion of the corrective inductance to reduce the distortion from the parasitic capacitance of the parasitic elements (124, 126). Such an embodiment, however, is not a requirement or limitation for the present invention. In fact, a single passive element may provide the entire corrective effect that reduces the distortion from the parasitic effect of one or more parasitic elements. The number of passive elements that reduce the distortion to acceptable levels or eliminate the distortion entirely will vary from one printed circuit board topology to another depending on the physical topology of the printed circuit board and the parasitic effects of the parasitic elements on a particular printed circuit board.

Printed circuit board designers may select the location along the conductive pathway (106) to mount the passive elements in a manner that optimizes the reduction of the signal distortion caused by the parasitic effect. In the example of FIG. 2B, the passive elements (200, 202) are mounted adjacent to the conductive pathway (106) between the transmitter (102) and the parasitic element (124) depicted in FIG. 2A. The passive elements (204, 206) of FIG. 2B are mounted adjacent to the conductive pathway (106) between the receiver (104) and the parasitic element (126) depicted in FIG. 2A. Readers will note that the particular placement along the conductive pathway (106) for mounting the passive elements (200, 202, 204, 206) of FIG. 2B is for explanation and not for limitation. The placement along the conductive pathway for mounting the passive elements will vary depending on the number of passive elements needed to reduce the distortion from the parasitic effect on the signal, the locations along the conductive pathway that optimize the reduction in signal distortion for a particular printed circuit board topology, and so on.

As mentioned above, when the parasitic effect produced by parasitic elements on the printed circuit board is parasitic capacitance, the passive element may be implemented as a trace in series with an inductor to provide corrective inductance. For further explanation, therefore, FIG. 3A sets forth a cross-sectional plan view of a further exemplary printed circuit board (100) for countering signal distortion according to embodiments of the present invention in which each passive element (200, 202, 204, 206) is implemented as a trace in series with an inductor. FIG. 3B sets forth a top plan view of the exemplary printed circuit board (100) of FIG. 3A.

Figure 3A:
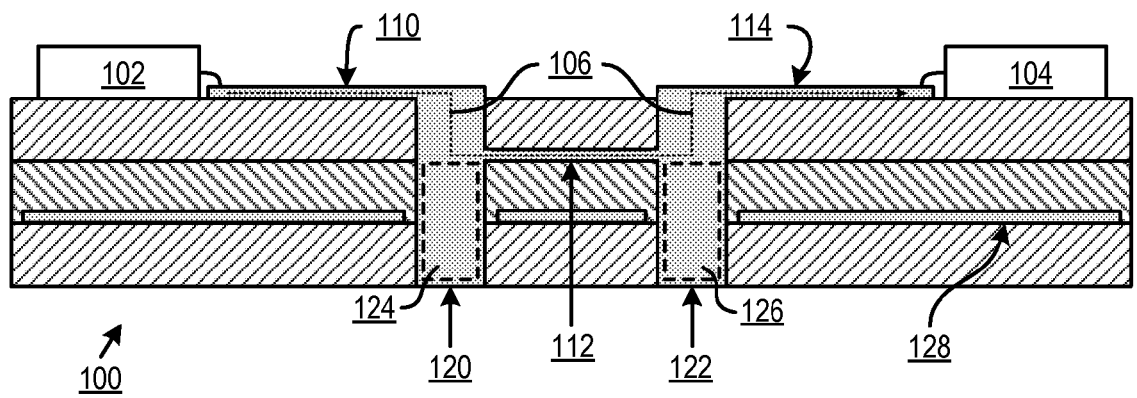
FIG. 3A sets forth a cross-sectional plan view of a further exemplary printed circuit board for countering signal distortion according to embodiments of the present invention.
Figure 3B:
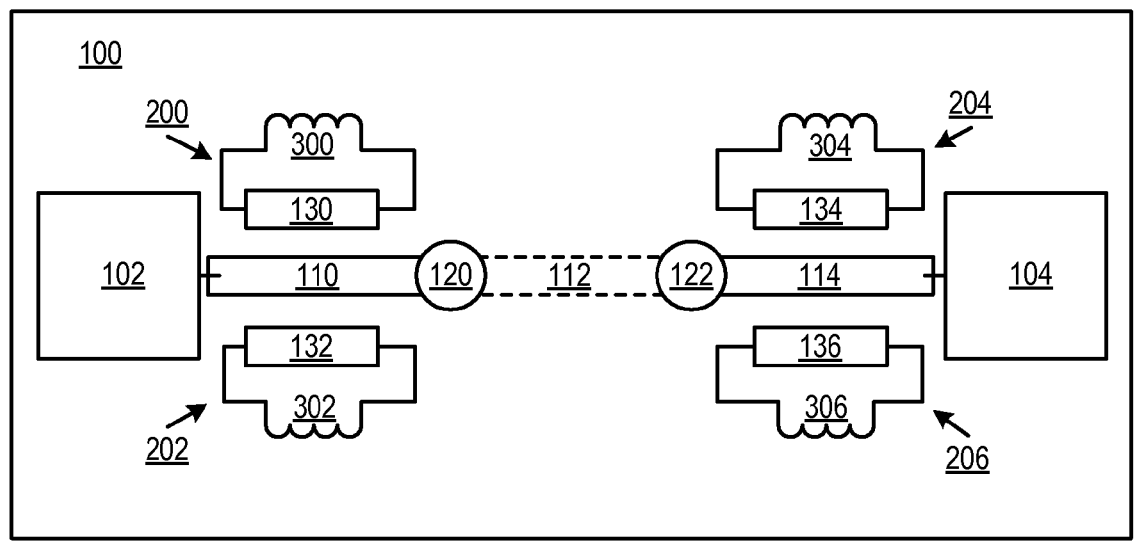
FIG. 3B sets forth a top plan view of the exemplary printed circuit board of FIG. 3A.

The printed circuit board (100) of FIGS. 3A and 3B is similar to the printed circuit board (100) of FIGS. 2A and 2B. The printed circuit board (100) of FIGS. 3A and 3B is similar to the printed circuit board (100) of FIGS. 2A and 2B in that the exemplary printed circuit board (100) of FIGS. 3A and 3B includes a conductive pathway (106) on the printed circuit board (100) between a transmitter (102) and a receiver (104). In the example of FIGS. 3A and 3B, the conductive pathway (106) includes traces (110, 112, 114) and vias (120, 122) connected together for conductive transfer of a signal from the transmitter (102) to the receiver (104). The printed circuit board (100) of FIGS. 3A and 3B also includes a reference plane (128) between the middle and lowest layers of the exemplary printed circuit board (100).

As shown in FIG. 3A, the exemplary printed circuit board (100) of FIGS. 3A and 3B also includes parasitic elements (124, 126) on the printed circuit board (100). The parasitic elements (124, 126) of FIG. 3A are the stubs formed from the unused portions of the vias (120, 122) respectively. The parasitic elements (124, 126) have a parasitic effect that distorts the signal transmitted from the transmitter (102) to the receiver (104). In the example of FIGS. 3A and 3B, the parasitic elements (124, 126) produce a parasitic effect in the form of parasitic capacitance. Such parasitic capacitance results from the stray electric charges that accumulate in the stubs (124, 126) due to the difference in voltage potential between the vias (120, 122) and the reference plane (128).

To counter to the parasitic capacitance, the exemplary printed circuit board (100) of FIGS. 3A and 3B includes passive elements (200, 202, 204, 206) mounted adjacent to the conductive pathway (106) without connecting to the conductive pathway (106). Each passive element (200, 202, 204, 206) is an passive electrical component providing a corrective effect to reduce the distortion from the parasitic effect on the signal. In the example of FIGS. 3A and 3B, the passive element (200) is implemented as trace (130) in series with inductor (300). The passive element (202) is implemented as trace (132) in series with inductor (302). The passive element (204) is implemented as trace (134) in series with inductor (304). The passive element (206) is implemented as trace (136) in series with inductor (306). Implementing a passive element as a trace in series with an inductor allows the passive element to advantageously provide a corrective inductance to substantially reduce or eliminate the distortion from the parasitic capacitance on the signal.

As mentioned above, when the parasitic effect produced by parasitic elements on the printed circuit board is parasitic inductance, the passive element may be implemented as a trace in series with a capacitor to provide corrective capacitance. For further explanation, therefore, FIG. 4A sets forth a cross-sectional plan view of a further exemplary printed circuit board (100) for countering signal distortion according to embodiments of the present invention in which each passive element (200, 202, 204, 206) is implemented as a trace in series with a capacitor. FIG. 4B sets forth a top plan view of the exemplary printed circuit board (100) of FIG. 4A.

Figure 4A:
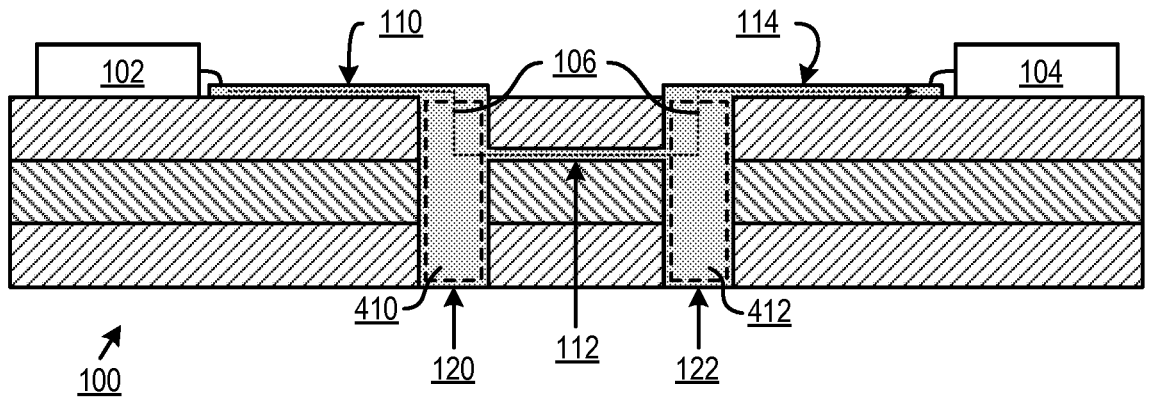
FIG. 4A sets forth a cross-sectional plan view of a further exemplary printed circuit board for countering signal distortion according to embodiments of the present invention.
Figure 4B:
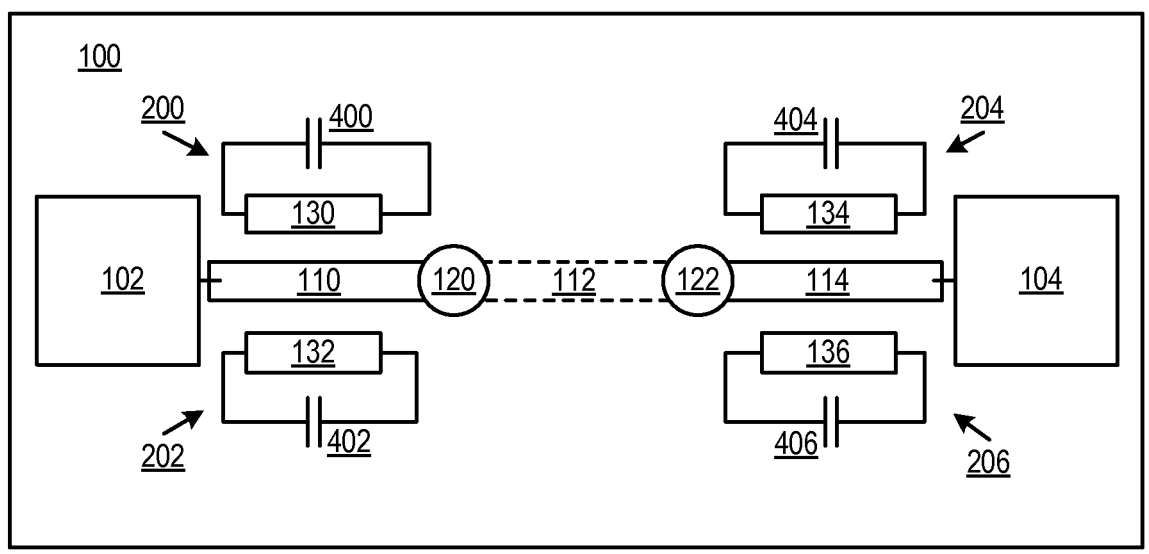
FIG. 4B sets forth a top plan view of the exemplary printed circuit board of FIG. 4A.

The printed circuit board (100) of FIGS. 4A and 4B is similar to the printed circuit board (100) of FIGS. 2A and 2B. The printed circuit board (100) of FIGS. 4A and 4B is similar to the printed circuit board (100) of FIGS. 2A and 2B in that the exemplary printed circuit board (100) of FIGS. 4A and 4B includes a conductive pathway (106) on the printed circuit board (100) between a transmitter (102) and a receiver (104). In the example of FIGS. 4A and 4B, the conductive pathway (106) includes traces (110, 112, 114) and vias (120, 122) connected together for conductive transfer of a signal from the transmitter (102) to the receiver (104).

As depicted in FIG. 4A, the exemplary printed circuit board (100) of FIGS. 4A and 4B also includes parasitic elements (410, 412) on the printed circuit board (100). The parasitic elements (410, 412) of FIG. 3A are the vias (120, 122) respectively included in the conductive pathway (106). The parasitic elements (410, 412) have a parasitic effect that distorts the signal transmitted from the transmitter (102) to the receiver (104). In the example of FIGS. 4A and 4B, the parasitic elements (124, 126) produce a parasitic effect in the form of parasitic inductance. Such parasitic inductance results from the stray magnetic field that accumulates around the vias (120, 122). The stray magnetic field results in a back electromotive force resisting changes to the current used to propagate the signal along the conductive pathway (106) from the transmitter (102) to the receiver (104).

To counter to the parasitic capacitance, the exemplary printed circuit board (100) of FIGS. 4A and 4B includes passive elements (200, 202, 204, 206) mounted adjacent to the conductive pathway (106) without connecting to the conductive pathway (106). Each passive element (200, 202, 204, 206) is an passive electrical component providing a corrective effect to reduce the distortion from the parasitic effect on the signal. In the example of FIGS. 4A and 4B, the passive element (200) is implemented as trace (130) in series with a capacitor (400). The passive element (202) is implemented as trace (132) in series with a capacitor (402). The passive element (204) is implemented as trace (134) in series with a capacitor (404). The passive element (206) is implemented as trace (136) in series with a capacitor (406).

Implementing a passive element as a trace in series with a capacitor allows the passive element to advantageously provide a corrective capacitance to substantially reduce or eliminate the distortion from the parasitic capacitance on the signal. As the signal propagates through the conductive pathway (106), a magnetic field is established around the conductive pathway (106) and induces movement of electric charges along each trace (130, 132, 134, 136). The movement of the electric charges in the traces (130, 132, 134, 136) results in a potential difference of the voltage across the capacitors (400, 402, 404, 406), respectively. When the magnetic field around the conductive pathway (106) that charged the capacitors collapses, the potential difference of the voltage across the capacitors (400, 402, 404, 406) induces movement of the electric charges in the traces (130, 132, 134, 136), respectively, in the opposite direction. As a result of this movement, magnetic fields are established around the traces (130, 132, 134, 136) that induce an electromotive force in the conductive pathway (106) that operates to resist changes in the voltage. In effect, the passive elements (200, 202, 204, 206) of FIG. 4B provide corrective capacitance to reduce the distortion from the parasitic inductance on the signal.

As mentioned above, exemplary methods of countering signal distortion on a printed circuit board in accordance with the present invention are described with reference to the accompanying drawings. For further explanation, FIG. 5 sets forth a flow chart illustrating an exemplary method of countering signal distortion on a printed circuit board according to embodiments of the present invention. The method of FIG. 5 includes transmitting (500) a signal, by a transmitter to a receiver, along a conductive pathway on a printed circuit board. The conductive pathway includes traces and vias connected together for conductive transfer of the signal from the transmitter to the receiver.

Figure 5:
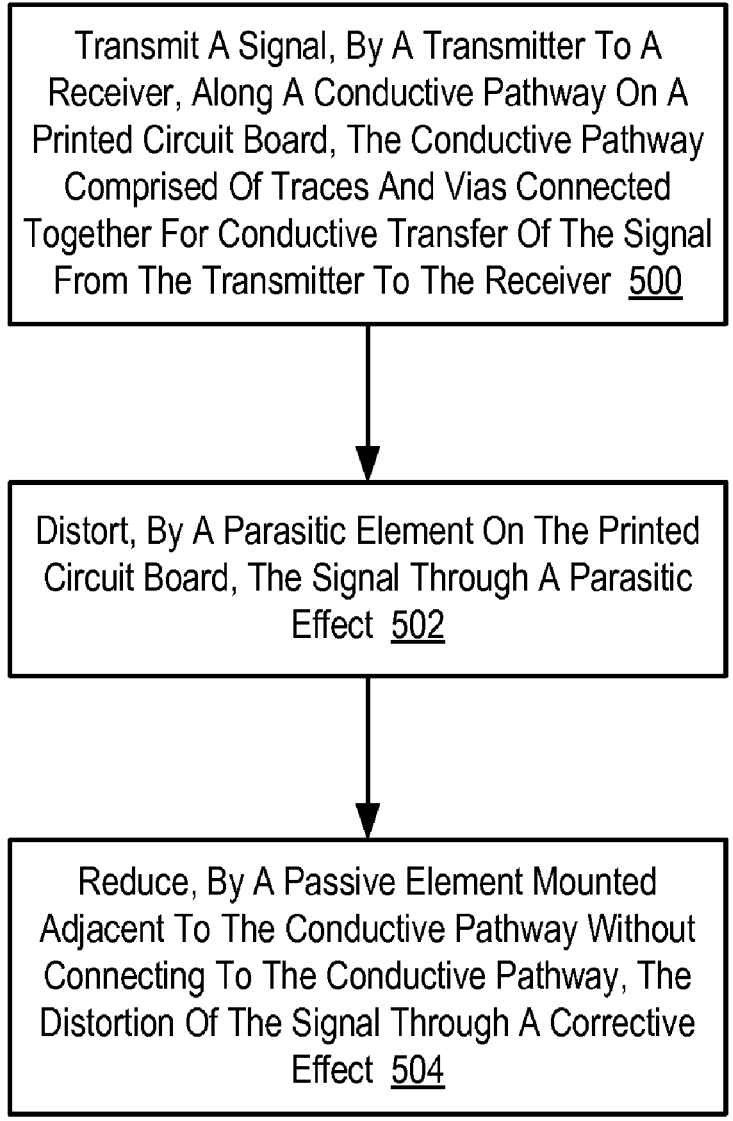
FIG. 5 sets forth a flow chart illustrating an exemplary method of countering signal distortion on a printed circuit board according to embodiments of the present invention.

The method of FIG. 5 also includes distorting (502), by a parasitic element on the printed circuit board, the signal through a parasitic effect. The parasitic element is an interconnect component of the printed circuit board that distorts a signal propagated from a transmitter to a receiver. A parasitic effect is the signal interference that results when the high frequency components of the signal interact with the physical topology of the printed circuit board used to interconnect the components. Examples of parasitic effects include parasitic capacitance and parasitic inductance. Parasitic capacitance is the capacitive interference that results from the storage of stray charges in the PCB elements that make up the conductive pathway between electronic components. Parasitic inductance is the inductive interference that results from the storage of a stray magnetic field around the PCB elements that make up the conductive pathway between electronic components.

The method of FIG. 5 also includes reducing (504), by a passive element mounted adjacent to the conductive pathway without connecting to the conductive pathway, the distortion of the signal through a corrective effect. A passive element is a passive electrical component providing a corrective effect to reduce the distortion from the parasitic effect on the signal. A corrective effect is counter interference for a signal that substantially reduces or eliminates the parasitic effect that distorts a signal. For example, when the parasitic effect produced by a parasitic element is a parasitic capacitance, the passive element provides a corrective effect that is implemented as corrective inductance to substantially reduce or eliminate the distortion from the parasitic capacitance on the signal. When the parasitic effect produced by a parasitic element is a parasitic inductance, the passive element provides a corrective effect that is implemented as corrective capacitance to substantially reduce or eliminate the distortion from the parasitic inductance on the signal. Substantially reducing or eliminating the distortion caused by a parasitic effect means that the relative strength of the components of a signal transmitted by a transmitter are substantially the same as the relative strength of the components of the signal when received by a receiver. That is, the signal remains intact as it propagates from the transmitter to the receiver although its overall amplitude may be reduced.

As mentioned above, the type of passive electric components used to implement the passive element useful in printed circuit boards for countering signal distortion according to embodiments of the present invention will depend on the type of correct effect needed to reduce the distortion. For example, when the parasitic effect is parasitic capacitance, the passive element may be implemented as a trace or a trace in series with an inductor to provide corrective inductance. When the parasitic effect is parasitic inductance, the passive element may be implemented as a trace in series with a capacitor to provide corrective capacitance.

Figure 6:
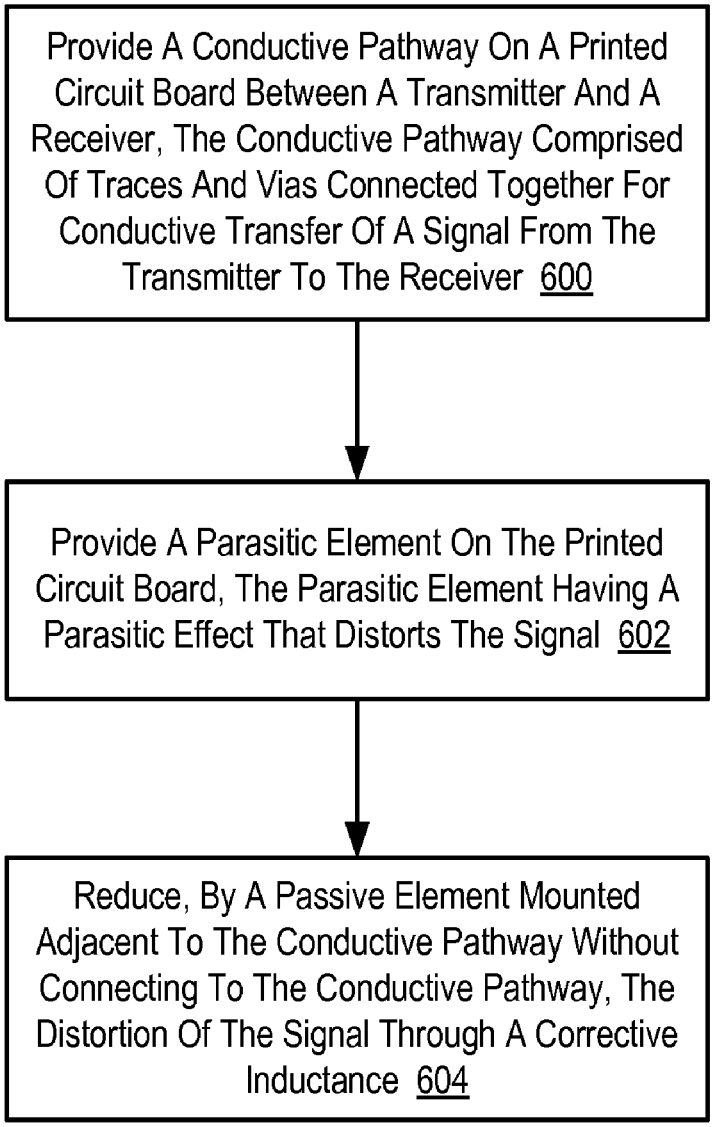
FIG. 6 sets forth a flow chart illustrating a further exemplary method of countering signal distortion on a printed circuit board according to embodiments of the present invention.

Turning now to FIG. 6: FIG. 6 sets forth a flow chart illustrating a further exemplary method of countering signal distortion on a printed circuit board according to embodiments of the present invention. The method of FIG. 6 includes providing (600) a conductive pathway on a printed circuit board between a transmitter and a receiver. The conductive pathway includes traces and vias connected together for conductive transfer of a signal from the transmitter to the receiver.

The method of FIG. 6 includes also providing (602) a parasitic element on the printed circuit board. The parasitic element is an interconnect component of the printed circuit board that distorts a signal propagated from a transmitter to a receiver. The parasitic element has a parasitic effect that distorts the signal. A parasitic effect is the signal interference that results when the high frequency components of the signal interact with the physical topology of the printed circuit board used to interconnect the components. As described above, examples of parasitic effects include parasitic capacitance and parasitic inductance.

The method of FIG. 6 includes reducing (604), by a passive element mounted adjacent to the conductive pathway without connecting to the conductive pathway, the distortion of the signal through a corrective inductance. A passive element is a passive electrical component providing a corrective effect to reduce the distortion from the parasitic effect on the signal. A corrective effect is counter interference for a signal that substantially reduces or eliminates the parasitic effect that distorts a signal and may include corrective inductance or corrective capacitance. As mentioned above, the type of passive electric components used to implement the passive element useful in printed circuit boards for countering signal distortion according to embodiments of the present invention will depend on the type of correct effect needed to reduce the distortion. For example, when the parasitic effect is parasitic capacitance, the passive element may be implemented as a trace or a trace in series with an inductor to provide corrective inductance. When the parasitic effect is parasitic inductance, the passive element may be implemented as a trace in series with a capacitor to provide corrective capacitance.

In view of the explanations set forth above, readers will recognize that the benefits of using printed circuit boards for countering signal distortion according to embodiments of the present invention include:
  lower design and manufacturing costs than current solutions for reducing signal distortion due to parasitic inductance and capacitance,
  the ability to substantially reduce or eliminate signal distortion due to parasitic inductance and capacitance for printed circuit board topologies unable to implement current solutions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A printed circuit board for countering signal distortion, the printed circuit board comprising:
  a conductive pathway on a printed circuit board between a transmitter and a receiver, the conductive pathway comprised of traces and vias connected together for conductive transfer of a signal from the transmitter to the receiver;
  a parasitic element on the printed circuit board, the parasitic element having a parasitic effect that distorts the signal; and
  one or more passive elements mounted adjacent to the conductive pathway without connecting to the conductive pathway, the passive elements having a corrective effect to reduce the distortion from the parasitic effect on the signal.

2. The printed circuit board of claim 1 wherein:
the parasitic effect is a parasitic capacitance; and
the corrective effect is a corrective inductance.

3. The printed circuit board of claim 1 wherein:
the parasitic effect is a parasitic inductance; and
the corrective effect is a corrective capacitance.

4. The printed circuit board of claim 1 wherein one of the passive elements comprises a trace.

5. The printed circuit board of claim 1 wherein one of the passive elements comprises a microstrip.

6. The printed circuit board of claim 1 wherein one of the passive elements comprises a trace in series with an inductor.

7. The printed circuit board of claim 1 wherein one of the passive elements comprises a trace in series with a capacitor.

8. The printed circuit board of claim 1 wherein one of the passive elements is mounted adjacent to the conductive pathway between the transmitter and the parasitic element.

9. The printed circuit board of claim 1 wherein one of the passive elements is mounted adjacent to the conductive pathway between the receiver and the parasitic element.

10. The printed circuit board of claim 1 wherein each passive element provides a portion of the corrective effect to reduce the distortion of the parasitic effect on the signal.

11. A method of countering signal distortion on a printed circuit board, the method comprising:
  transmitting a signal, by a transmitter to a receiver, along a conductive pathway on a printed circuit board, the conductive pathway comprised of traces and vias connected together for conductive transfer of the signal from the transmitter to the receiver;
  distorting, by a parasitic element on the printed circuit board, the signal through a parasitic effect; and
  reducing, by a passive element mounted adjacent to the conductive pathway without connecting to the conductive pathway, the distortion of the signal through a corrective effect.

12. The method of claim 11 wherein:
the parasitic effect is a parasitic capacitance; and
the corrective effect is a corrective inductance.

13. The method of claim 11 wherein:
the parasitic effect is a parasitic inductance; and
the corrective effect is a corrective capacitance.

14. The method of claim 11 wherein one of the passive elements comprises a trace.

15. The method of claim 11 wherein one of the passive elements comprises a trace in series with a capacitor.

16. A method of countering signal distortion on a printed circuit board, the method comprising:
providing a conductive pathway on a printed circuit board between a transmitter and a receiver, the conductive pathway comprised of traces and vias connected together for conductive transfer of a signal from the transmitter to the receiver;
providing a parasitic element on the printed circuit board, the parasitic element having a parasitic effect that distorts the signal; and
reducing, by a passive element mounted adjacent to the conductive pathway without connecting to the conductive pathway, the distortion of the signal through a corrective inductance.

17. The method of claim 16 wherein:
the parasitic effect is a parasitic capacitance; and
the corrective effect is a corrective inductance.

18. The method of claim 16 wherein:
the parasitic effect is a parasitic inductance; and
the corrective effect is a corrective capacitance.

19. The method of claim 16 wherein one of the passive elements comprises a trace.

20. The method of claim 16 wherein one of the passive elements comprises a trace in series with a capacitor.

* * * * *